United States Patent
Kwon

(10) Patent No.: US 7,505,351 B2
(45) Date of Patent: Mar. 17, 2009

(54) DATA OUTPUT CIRCUIT OF SEMICONDUCTOR MEMORY APPARATUS AND METHOD OF CONTROLLING THE SAME

(75) Inventor: Dae Han Kwon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 132 days.

(21) Appl. No.: 11/646,351

(22) Filed: Dec. 28, 2006

(65) Prior Publication Data

US 2007/0237019 A1 Oct. 11, 2007

(30) Foreign Application Priority Data

Apr. 5, 2006 (KR) .................. 10-2006-0030933

(51) Int. Cl.
*G11C 8/00* (2006.01)
(52) U.S. Cl. .................. 365/230.03; 365/230.01; 365/241
(58) Field of Classification Search ............ 365/230.03, 365/230.01, 241
See application file for complete search history.

(56) References Cited

U.S. PATENT DOCUMENTS

| 5,661,688 | A | 8/1997 | Yim et al. |
| 5,798,969 | A * | 8/1998 | Yoo et al. ............ 365/189.05 |
| 6,434,661 | B1 | 8/2002 | Konishi et al. |
| 7,020,029 | B2 | 3/2006 | Lee |
| 7,126,864 | B2 * | 10/2006 | Chung ................ 365/200 |
| 2006/0109724 | A1 * | 5/2006 | Chung ................ 365/200 |

FOREIGN PATENT DOCUMENTS

| KR | 1020020032022 | 5/2002 |
| KR | 1020040015589 | 2/2004 |
| KR | 1020040096071 | 11/2004 |
| KR | 1020050003529 | 1/2005 |
| KR | 1020060015983 | 2/2006 |

* cited by examiner

*Primary Examiner*—Thong Q Le
(74) *Attorney, Agent, or Firm*—Venable LLP; Jeffri A. Kaminski

(57) ABSTRACT

The data output circuit for a semiconductor memory apparatus includes a plurality of pads in which a range of use is determined such that the respective pads are used exclusively in each of at least two kinds of unit data output modes or used commonly in all of the at least two kinds of unit data output modes, a plurality of data lines that transmit data from a plurality of memory banks to the outside of the memory banks, and a data output control unit that outputs data from a data line among the plurality of data lines, according to at least one control signal, to a signal line corresponding to a pad used in a currently set unit data output mode among the plurality of pads.

36 Claims, 7 Drawing Sheets

FIG. 8

|  |  | 256Mb | 512Mb | 1Gb |
|---|---|---|---|---|
| x8 | Row Address | A0-A12 | A0-A12 | A0-A13 |
|  | Column Address | A0-A9 | A0-A9,A11 | A0-A9,A11 |
| x16 | Row Address | A0-A12 | A0-A12 | A0-A13 |
|  | Column Address | A0-A8 | A0-A9 | A0-A9 |
| x32 | Row Address | A0-A11 | A0-A12 | A0-A12 |
|  | Column Address | A0-A8 | A0-A8 | A0-A9 |

DATA OUTPUT CIRCUIT OF SEMICONDUCTOR MEMORY APPARATUS AND METHOD OF CONTROLLING THE SAME

BACKGROUND

1. Technical Field

The present invention relates to a semiconductor memory apparatus, and more particularly, to a data output circuit and method for a semiconductor memory apparatus.

2. Related Art

A semiconductor memory apparatus according to the related art having the configuration shown in FIG. 1 has first to third unit data output modes (hereinafter, referred to as an X32 mode, an X16 mode, and an X8 mode) in which the number of data bits output according to a one-time read command are 32, 16, and 8, respectively.

The semiconductor memory apparatus according to the related art shown in FIG. 1 includes a memory bank 10, a plurality of data lines GIO<0> to GIO<31>, a data output unit 20, and a pad unit 30. The memory bank 10 includes cell array 11 and a sense amplifier array 12 that includes a plurality of data bus sense amplifiers (hereinafter, simply referred to as sense amplifier), the plurality of data lines GIO<0> to GIO<31> corresponding to the respective sense amplifiers of the sense amplifier array 12 such that cell data inside the memory bank 10 corresponding to a row address and a column address is output to the outside of the memory bank 100, the data output unit 20 stores or drives the data of the data lines GIO<0> to GIO<31> so as to be output to the outside of the semiconductor memory apparatus, and the pad unit 30 has thirty-two pads that output the data driven by the data output unit 20 to the outside of the semiconductor memory apparatus.

The plurality of data lines GIO<0> to GIO<31> correspond to the zero to thirty-first pads of the pad unit 30 through the data output unit 20, respectively.

Further, all of the thirty-two pads are used when the semiconductor memory apparatus operates in the X32 mode, sixteen pads are used when the semiconductor memory apparatus operates in the X16 mode, and eight pads are used when the semiconductor memory apparatus operates in the X8 mode. Accordingly, the thirty-two pads may be divided into pads used only in the X32 mode, pads commonly-used in both the X32 mode and the X16 mode, and pads commonly used in all of the X32 mode, the X16 mode, and the X8 mode, which is determined in advance when designing the semiconductor memory apparatus.

The sense amplifiers of the sense amplifier array 12 are disposed in a repeating pattern in the order of a sense amplifier DBSA_X8, a sense amplifier DBSA_X32, a sense amplifier DBSA_X16, and a sense amplifier DBSA_X32, as shown in FIG. 1.

The sense amplifier DBSA_X8 operates in the X32 mode, the X16 mode, and the X8 mode, the sense amplifier DBSA_X32 operates only in the X32 mode, and the sense amplifier DBSA_X16 operates in both the X32 mode and the X16 mode.

When the semiconductor memory apparatus operates in the X32 mode, all of the sense amplifiers of the sense amplifier array 12 operate, and the data is outputted through the data lines GIO<0> to GIO<31> corresponding to the sense amplifiers.

When the semiconductor memory apparatus operates in the X16 mode, all of the sense amplifiers DBSA_X8 and DBSA_X16 of the sense amplifier array 12 operate, and the data is output through the data lines GIO<0>, GIO<2>, GIO<28>, GIO<29>, and GIO<30> corresponding to the sense amplifiers.

When the semiconductor memory apparatus operates in the X8 mode, all of the sense amplifiers DBSA_X8 of the sense amplifier array 12 operate, and the data is output through the data lines GIO<0>, GIO<4>, . . . , and GIO<28> corresponding to the sense amplifiers.

However, the sense amplifiers that detect and amplify data in cells corresponding to the row address and the column address do not completely match with the sense amplifiers corresponding to the X32 mode, the X16 mode, and the X8 mode.

For example, when the semiconductor memory apparatus operates in the X8 mode, first bit data among eight-bit data needs to be output through the data line GIO<0>.

However, when one of the sense amplifiers that detects and amplifies data in cells corresponding to the row address and the column address is a sense amplifier DBSA_X32 that is coupled to data buses Lio<1> and Liob<1> inside the memory bank, data cannot be output in a normal state.

For this reason, according to the related art as shown in FIG. 1, the local data bus lines ldb_X16<1>, ldb_X16<3>, and ldb_X8<1:3> are coupled to the sense amplifiers that are coupled to the GIO lines and used in respective modes including the X32 mode, the X16 mode, and the X8 mode, such that the data is transmitted to the sense amplifiers.

Accordingly, when the semiconductor memory apparatus operates in the X8 mode, even if the sense amplifier that senses and amplifies the data in the cells corresponding to the row address and the column address corresponds to any one of the sense amplifiers DBSA_X8, DBSA_X32, DBSA_X16, and DBSA_X32, the corresponding data is transmitted to the sense amplifier DBSA_X8, and the data can be output in a normal state.

By the same principle, even when the semiconductor memory apparatus operates in the X16 mode, data can be normally output to the sense amplifiers DBSA_X8 and DBSA_X16 by the local data bus lines ldb_X16<1> and ldb_X16<3>.

However, the semiconductor memory apparatus according to the related art that is used in each of the X32 mode, the X16 mode, and the X8 mode has the following problems.

First, in order to transmit the data among the sense amplifiers used in the respective X32, X16, and X8 modes, the local data bus lines are coupled to the sense amplifiers. As a result, a layout area is increased, and it becomes difficult to design a circuit. This problem may become intensified as a memory capacity is increased.

Second, since it takes time for the data to be transmitted through the local data bus lines coupled among the sense amplifiers; a data output time is increased.

SUMMARY

An embodiment of the present invention provides a data output circuit and method, for a semiconductor memory apparatus that may be capable of reducing a layout area and simplifying a circuit design.

Another embodiment of the present invention provides an output circuit and method for a semiconductor memory apparatus that may be capable of reducing a data output time.

A first embodiment of the present invention provides a data output circuit for a semiconductor memory apparatus that may include; a plurality of pads in which the range of use may be determined such that the respective pads may be used exclusively in each of at least two kinds of unit data output modes or may be used commonly in all of the at least two kinds of unit data output modes; a plurality of data lines that may transmit data from a plurality of memory banks to the outside of the memory banks; and a data output control unit that may outputs data from a data line among the plurality of data lines, according to at least one control signal, to a signal line corresponding to a pad used in a currently set unit data output mode among the plurality of pads.

A second embodiment of the present invention provides an output circuit for a semiconductor memory apparatus that may be used for all of first to third unit data output modes in which the numbers of bits of data output according to a one-time read command are respectively 32, 16, or 8. The data output circuit may include a plurality of pads in which pads used in at least one among the first to third unit data output modes may be determined; a plurality of data lines that may transmit data from memory banks to the outside of the memory banks, and a data output control unit that may output data from a data line among the plurality of data lines, according to at least one of either a first control signal or a second control signal, to a signal line corresponding to a pad used in a currently set unit data output mode among the plurality of pads.

A third embodiment of the present invention provides a method of outputting data from a semiconductor memory apparatus that may include a plurality of pads in which a range of use may be determined such that the respective-pads may be used exclusively in each of at least two kinds of unit data output modes or may be used commonly in all of the at least two kinds of unit data output modes, and a plurality of data lines that may transmit data of a plurality of memory banks to the outside of the memory banks. The method may include acquiring at least one control signal so as to output data from a memory bank according to a read command, selecting a data line according to the at least one acquired control signal, and outputting data from the selected data line to a signal line corresponding to a pad used in a currently set unit data output mode among the plurality of pads.

A fourth embodiment of the present invention provides a method of outputting data of a semiconductor memory apparatus that may include a plurality of pads in which a range of use may be determined such that the respective pads may be used exclusively in each of at least two kinds of unit data output modes or may be used commonly in all of the at least two kinds of unit data output modes, and a plurality of data lines that may transmit data from a plurality of memory banks to the outside of the memory banks. The method may include detecting a row address corresponding to a memory bank to which a read command may be input, selecting a data line according to at least one of either the row address or a column address from among the plurality of data lines, and outputting data from the selected data line to a signal line corresponding to a pad used in a currently set unit data output mode among the plurality of pads.

BRIEF DESCRIPTION OF THE DRAWINGS

FIG. 8 is an exemplary data table illustrating an address specification of a semiconductor memory apparatus.

DESCRIPTION OF EXEMPLARY EMBODIMENTS

Embodiments of the present invention will now be described in detail with reference to the accompanying drawings.

Figure 1:
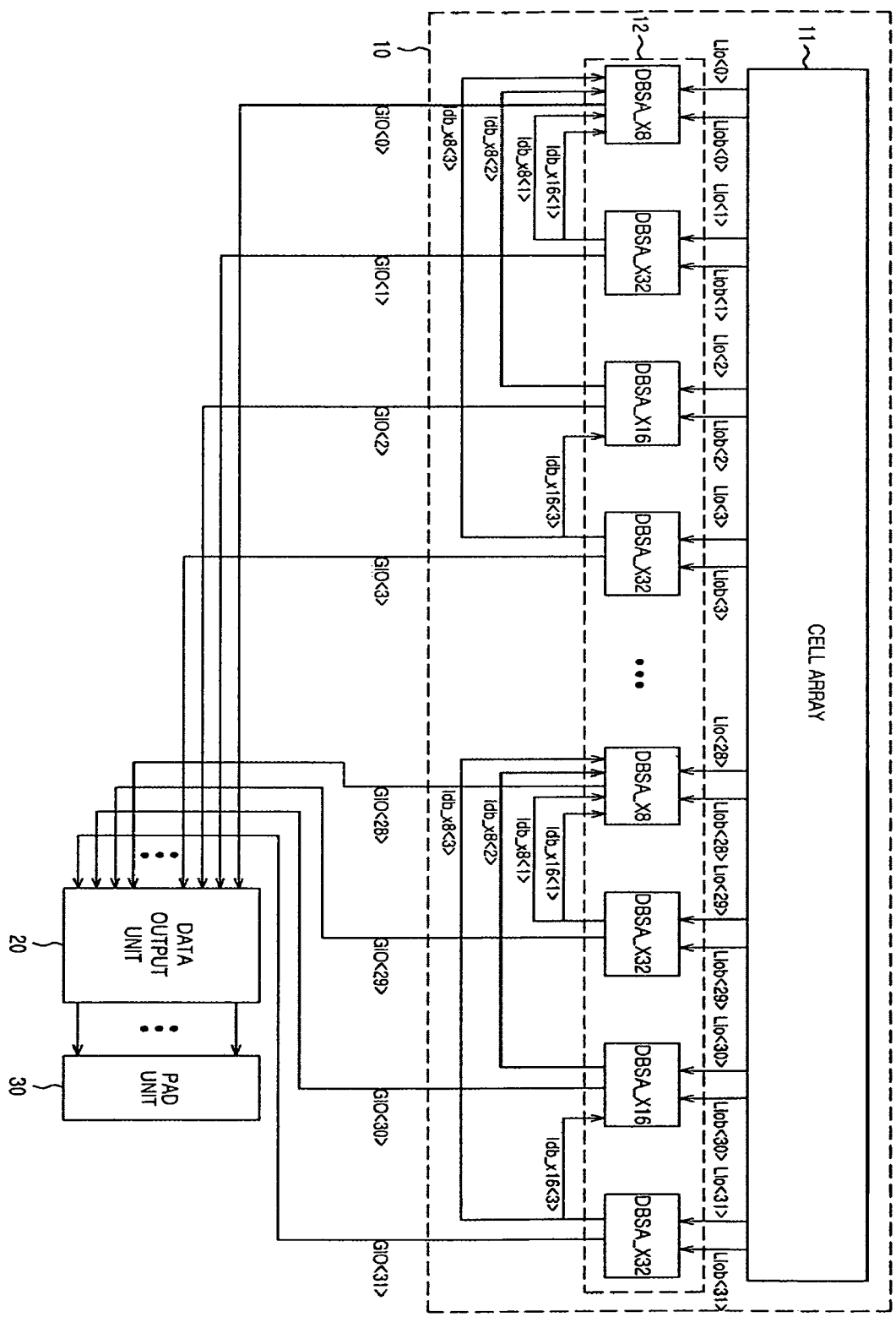
FIG. 1 is a block diagram illustrating the configuration of a data output circuit of a semiconductor memory apparatus according to the related art.
Figure 2:
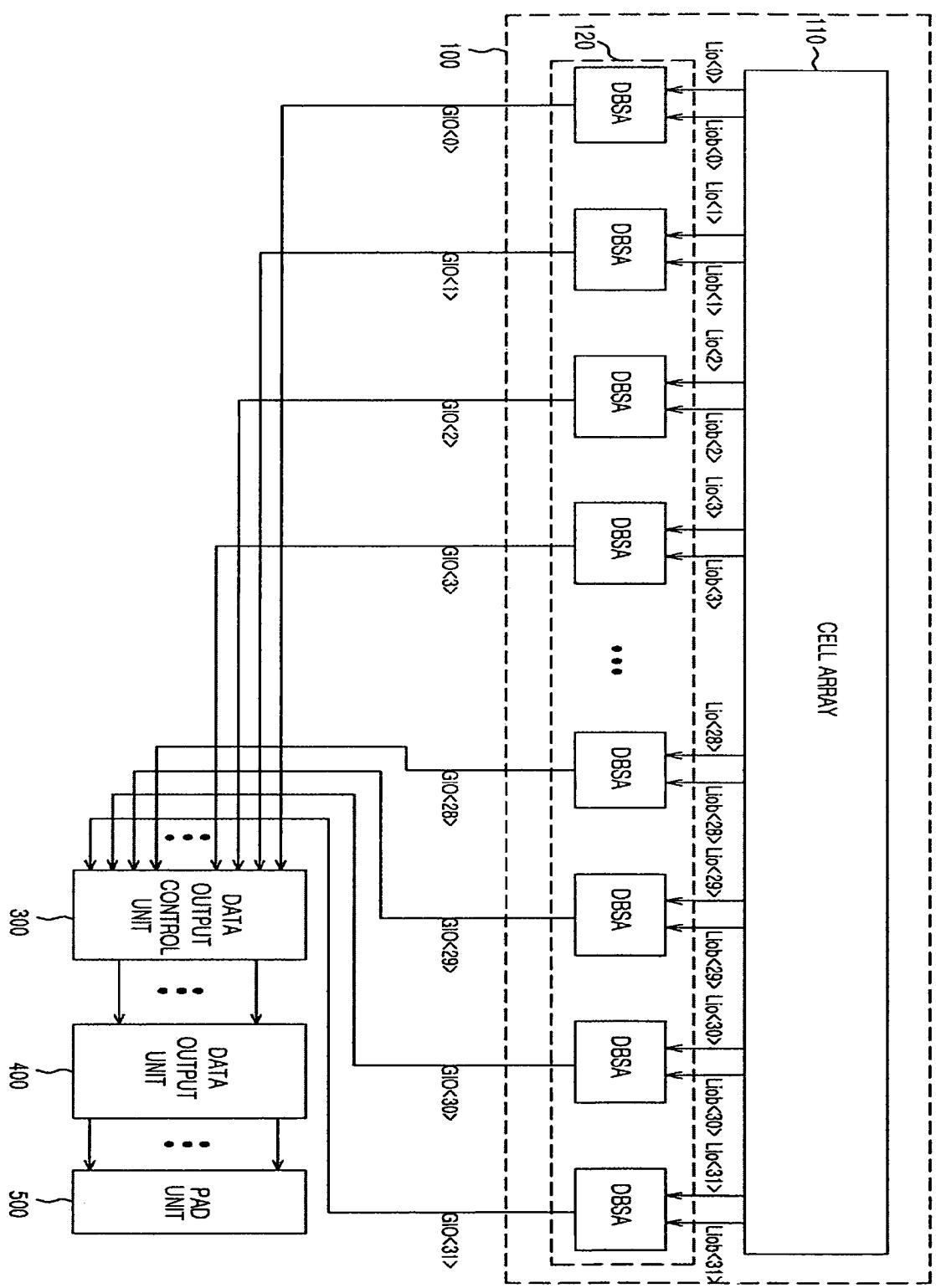
FIG. 2 is a block diagram illustrating the configuration of a data output circuit of a semiconductor memory apparatus according to an embodiment of the present invention.

As shown in FIG. 2, a data output circuit of a semiconductor memory apparatus according to an embodiment of the invention may include a memory bank 100, a plurality of data lines GIO<0> to GIO<31>, a pad unit 500, a data output control unit 300, and a data output unit 400. The memory bank 100 may include cell array 110 and a sense amplifier array 120 that may include a plurality of data bus sense amplifiers (hereinafter, simply referred to as sense amplifier). The plurality of data lines GIO<0> to GIO<31> may correspond to the respective sense amplifiers of the sense amplifier array 120 such that cell data inside the memory bank 100 corresponding to a row address and a column address may be output to the outside of the memory bank 100. The pad unit 500 may include a plurality of pads in which pads are determined to be used for at least one of first to third unit data output modes (that is, an X32 mode, an X16 mode, and an X8 mode). The data output control unit 300 may output data from a data line among the plurality of data lines GIO<0> to GIO<31>, according to at least one of either a first control signal or a second control signal, to a signal line corresponding to a pad used in a currently set unit data output mode among the plurality of pads. The data output unit 400 may store and drive the data output by the data output unit 300 and output it to the pad unit 500 so it may be output to the outside of the semiconductor memory apparatus.

The plurality of data lines GIO<0> to GIO<31> may be commonly used in all memory banks and divided into a plurality of, groups, each of which may have at least four data lines, and the number of used data lines may be determined for each of the X32 mode, the X16 mode, and the X8 mode in each group. For example, if referring to a first group GIO<0:3> among groups of all of the data lines shown in FIG. 2, all of the data lines of the first group GIO<0:3> are used in the X32 mode, one of either the data line GIO<0> or the data line GIO<1> and one of either the data line GIO<2> or the data line GIO<3> are used in the X16 mode, and any one of the data lines of the first group GIO<0:3> may be freely used in the X8 mode. This may be applicable to the other groups.

The first control signal may be a row address GAX_rd of a memory bank corresponding to a read command, and the second control signal may be a column address GAY_rd.

Figure 3:
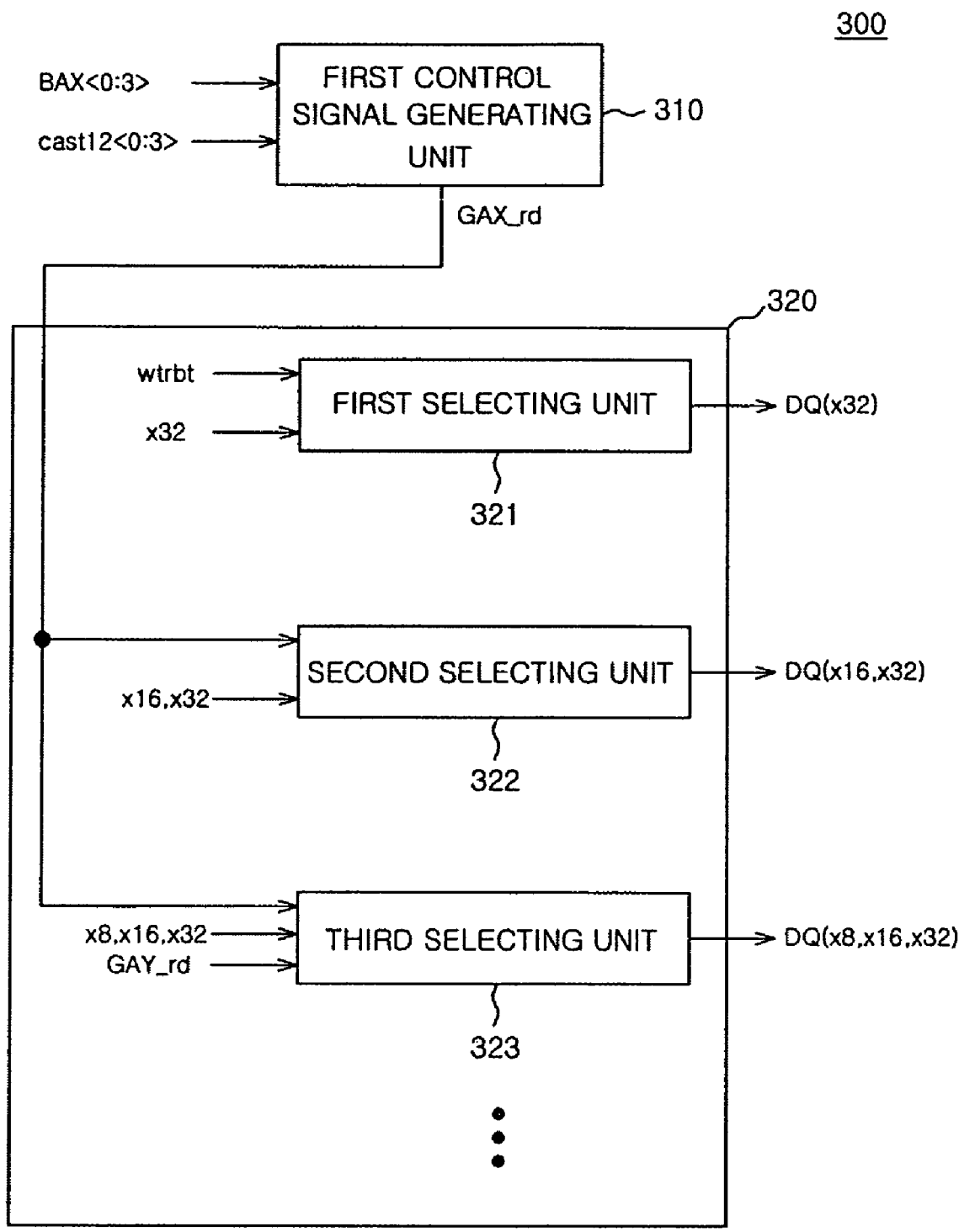
FIG. 3 is a block diagram illustrating the internal configuration of the exemplary data output control unit of FIG. 2.

As shown in FIG. 3, the data output control unit 300 may include a first control signal generating unit 310 that may generate the row address GAX_rd using a row address BAX<0:3> stored for each memory bank; and a command recognition signal cast12<0:3> that may be enabled only when a read command is input for each memory bank, and a data selecting unit 320 that selects data from a data line according to at least one of either the row address GAX_rd or the column address GAY_rd, and may output the data to a signal line corresponding to a pad used in a currently selected unit data output mode among the plurality of pads.

The data selecting unit 320 may include a first selecting unit 321 that may output, when a read/write classification signal wtrbt is at a level for a read operation and a signal X32 for selecting the X32 mode is enabled, data from a data line coupled to the first selecting unit 321 to a signal line corresponding to a pad used in the X32 mode; a second selecting unit 322 that may output, when the read/write classification signal wtrbt is at a level for a read operation and one among signals X32 and X16 for selecting the X32 and X16 modes is enabled, data from a data line according to the row address GAX_rd among data lines coupled to the second selecting unit 322 to a signal line corresponding to a pad used in the X32 mode and the X16 mode; and a third selecting unit 323 that may output, when the read/write classification signal wtrbt is at a level for a read operation and one among signals for selecting the X32 mode, the X16 mode, and the X8 mode is enabled, data from a data line according to the row address GAX_rd and the column address GAY_rd among data lines coupled to the third selecting unit 323 to a signal line corresponding to a pad used in the X32 mode, the X16 mode, and the X8 mode.

Figure 4:
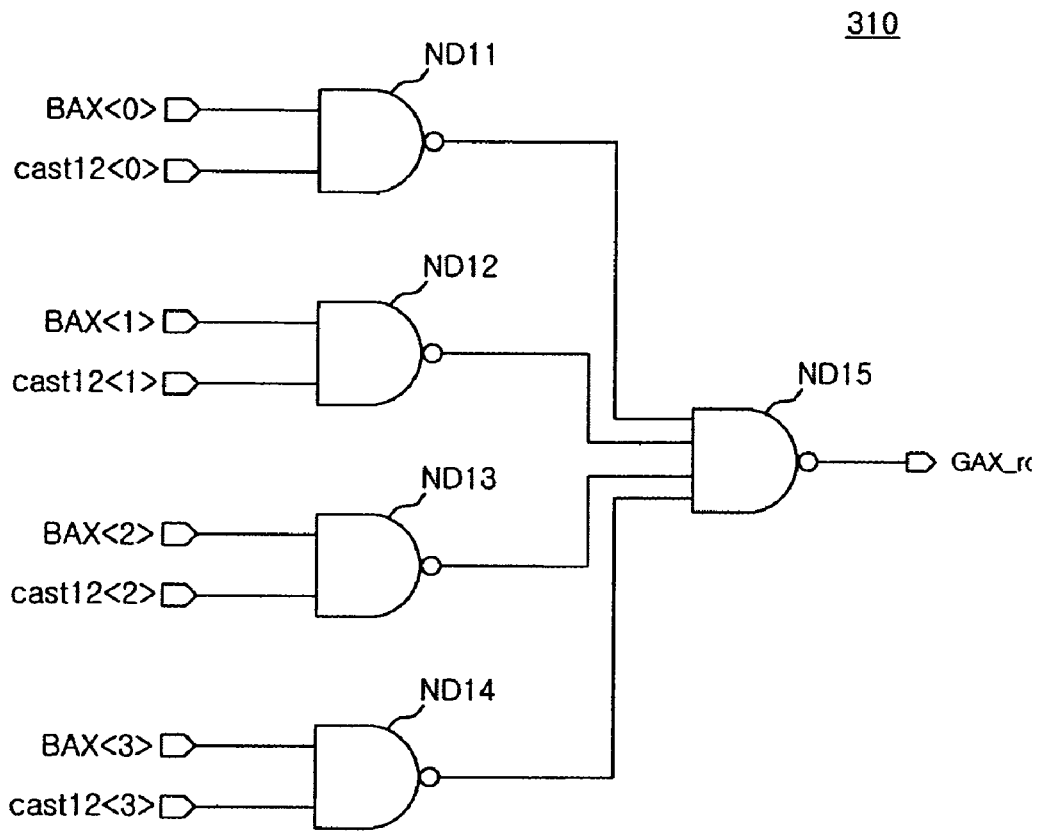
FIG. 4 is a circuit diagram illustrating the configuration of the exemplary first control signal generating unit of FIG. 3.

As shown in FIG. 4, the first control signal generating unit 310 may include a plurality of first NAND gates ND11 to ND14, each of which may receive one signal pair according to a sequence in the same memory bank among the row addresses BAX<0:3> and the command recognition signals cast12<0:3>, and a second NAND gate ND15 that may receive the outputs of the plurality of first NAND gates ND11 to ND14 and output the row address GAX_rd.

Figure 5:
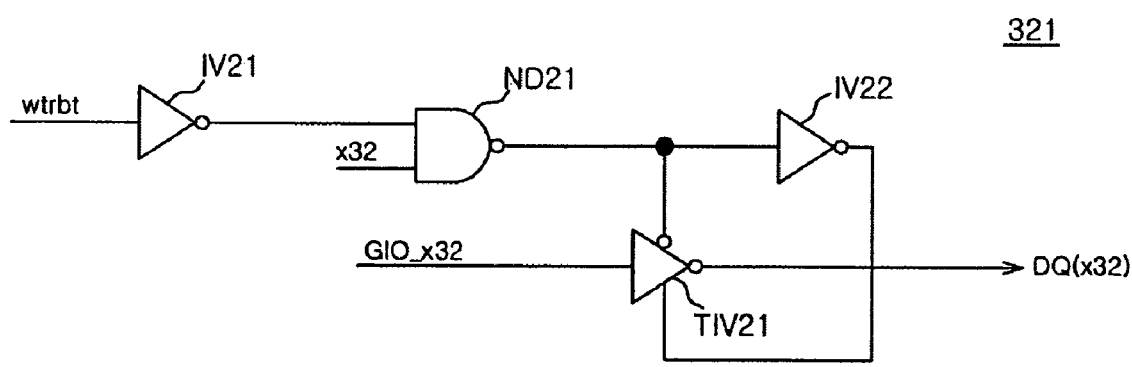
FIG. 5 is a circuit diagram illustrating the internal configuration of the exemplary first selecting unit of FIG. 3.

As shown in FIG. 5, the first selecting unit 321 may include a first inverter IV21 that may receive the read/write classification signal wtrbt, a NAND gate ND21 that may receive the output of the first inverter IV21 and the X32 mode selecting signal X32, a second inverter IV22 that may receive the output of the NAND gate ND21, and a tri-state inverter TIV21 that may output data from a data line GIO_X32 coupled to the tri-state inverter TIV21 according to the output of the NAND gate ND21 and the output of the second inverter IV22.

Figure 6:
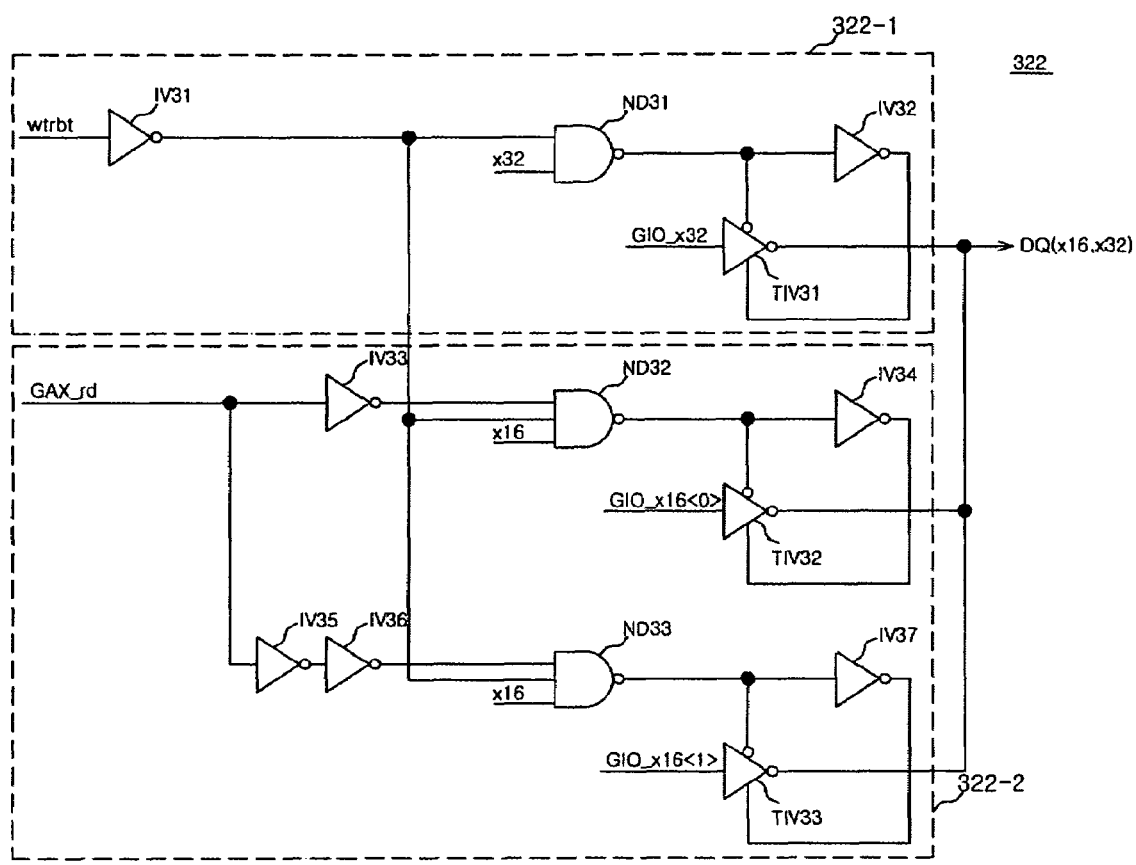
FIG. 6 is a circuit diagram illustrating the internal configuration of the exemplary second selecting unit of FIG. 3.

As shown in FIG. 6, the second selecting unit 322 may include a first mode selecting unit 322-1 that may output, when a read/write classification signal wtrbt is at a level for a read operation and the X32 mode selecting signal X32 is enabled, data from a data line GIO_X32 coupled to the first mode selecting unit 322-1 to a signal line corresponding to a pad used in the X32 mode; and a second mode selecting unit 322-2 that may output, when the read/write classification signal wtrbt is at a level for a read operation and the X16 mode selecting signal X16 is enabled, data from a data line according to the row address GAX_rd among a plurality of data lines GIO_X16<0> and GIO_X16<1> coupled to the second mode selecting unit 322-2 to a signal line corresponding to a pad used in the X16 mode.

As shown in FIG. 6, the first mode selecting unit 322-1 may include a first inverter IV31 that may receive the read/write-classification signal wtrbt, a NAND gate ND31 that may receive the output of the first inverter IV31 and the X32 mode selecting signal X32, a second inverter IV32 that may receive the output of the first NAND gate ND31, and a tri-state inverter TIV31 that may output data from a data line GIO_X32 according to the output of the first NAND gate ND31 and the output of the second inverter IV32.

As shown in FIG. 6, the second mode selecting unit 322-2 may include a third inverter IV33 that may receive the row address GAX_rd; a second NAND gate ND32 that may receive the output of the third inverter IV33, the read/write classification signal; and the X16 mode selecting signal, a fourth inverter IV34 that may receive the output of the second NAND gate ND32; a second tri-state inverter TIV32 that may receive data from a data line GIO_X16<0> according to the output of the second NAND gate ND32 and the output of the fourth inverter IV34; a fifth inverter IV35 that may receive the row address GAX_rd; a sixth inverter IV36 that may receive the output of the fifth inverter IV35; a third NAND gate ND33 that may receive the output of the sixth inverter IV36, the read/write classification signal wtrbt, and the X16 mode selecting signal X16; a seventh inverter IV37 that may receive the output of the third NAND gate ND33, and a third tri-state inverter TIV33 that may output data from a data line GIO_X16<1> according to the output of the third NAND gate ND33 and the output of the seventh inverter IV37.

Figure 7:
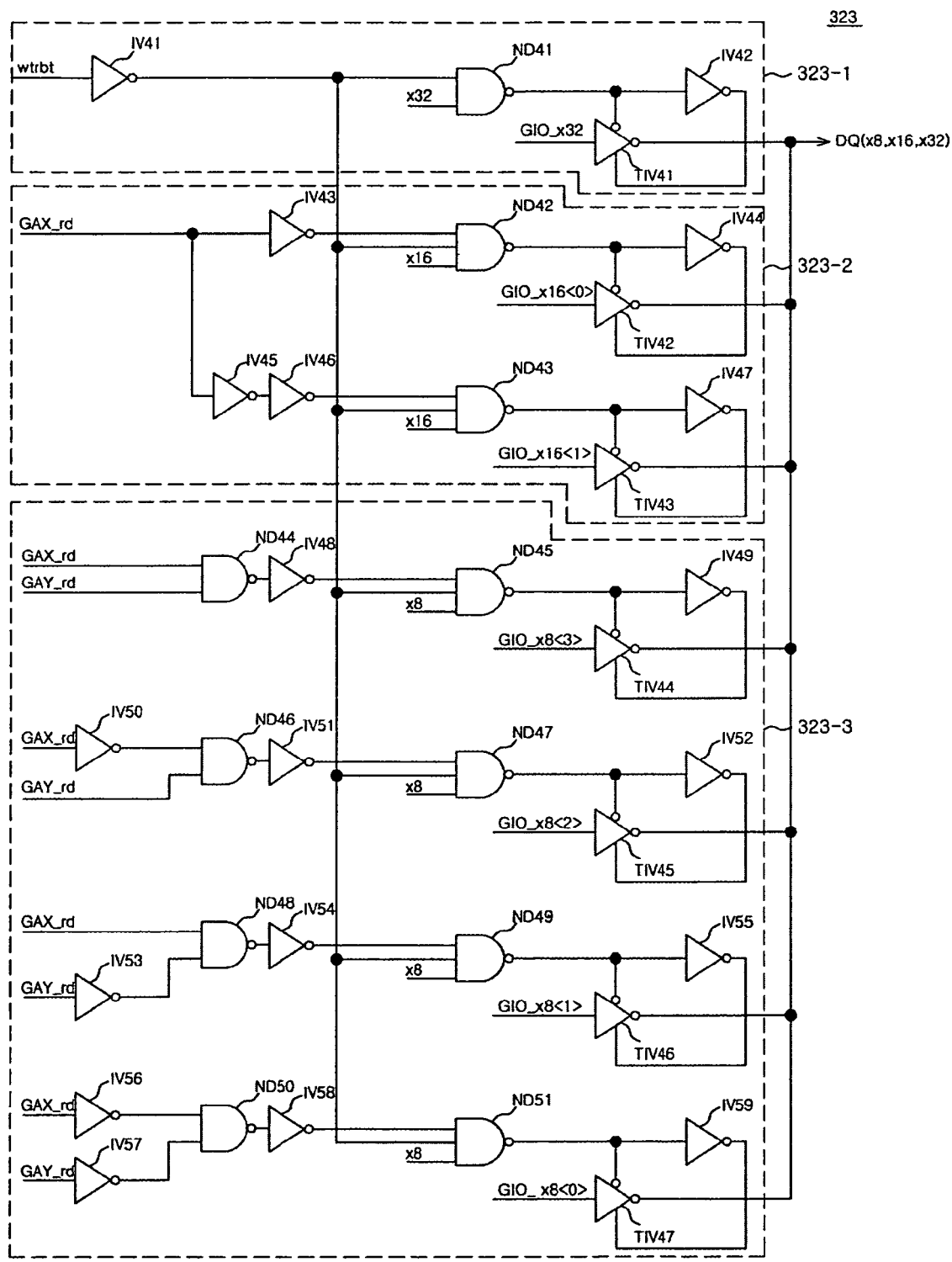
FIG. 7 is a circuit diagram illustrating the internal-configuration of the exemplary third selecting unit of FIG. 3.

As shown in FIG. 7, the third selecting unit 323 may include a first mode selecting unit 323-1 that may output, when the read/write classification signal wtrbt is at a level for a read operation and the X32 mode selecting signal is enabled, data from a data line GIO_X32 to a signal line corresponding to a pad used in the X32 mode; a second mode selecting unit 323-2 that may output, when the read/write classification signal wtrbt is at a level for a read operation and the X16 mode selecting signal X16 is enabled, data from a data line according to the row address GAX_rd among a plurality of data lines GIO_X16<0> and GIO_X16<1> coupled to the second mode selecting unit 323-2 to a signal line corresponding to a pad used in the X16 mode; and a third mode selecting unit 323-3 that may output, when the read/write classification signal wtrbt is at a level for a read operation and the X8 mode selecting signal is enabled, data from a data line according to the row address GAX_rd and the column address GAY_rd among a plurality of data lines GIO_X8<0:3> coupled to the third mode selecting unit 323-3 to a signal line corresponding to a pad used in the X8 mode.

As shown in FIG. 7, the first mode selecting unit 323-1 may include a first inverter IV41 that may receive the read/write classification signal wtrbt, a first NAND gate ND41 that may receive the output of the first inverter IV41 and the X32 mode selecting signal X32, a second inverter IV42 that may receive the output of the first NAND gate ND41, and a tri-state inverter TIV41 that may output data from a data line GIO_X32 according, to the output of the NAND gate ND41 and the output of the second inverter IV42.

As shown in FIG. 7, the second mode selecting unit 323-2 may include a third inverter IV43 that may receive the row address GAX_rd; a second NAND gate ND42 that may receive the output of the third inverter IV43, the read/write discriminating signal wtrbt, and the X16 mode selecting signal X16; a fourth inverter IV44 that may receive the output of the second NAND gate ND42; a second tri-state inverter TIV42 that may output data from a data line GIO_X16<0> according to the output of the second NAND gate ND42 and the output of the fourth inverter IV44; a fifth inverter IV45 that may receive the row address GAX_rd; a sixth inverter IV46 that may receive the output of the fifth inverter IV45; a third NAND gate ND43 that may receive the output of the sixth inverter IV46, the read/write classification signal wtrbt, and the X16 mode selecting signal X16; a seventh inverter IV47 that may receive the output of the third NAND gate ND43; and a third tri-state inverter TIV43 that may output data from a data line GIO_X16<1> according to the output of the third NAND gate ND43 and the output of the seventh inverter IV47.

As shown in FIG. 7, the third mode selecting unit 323-3 may include a fourth NAND gate ND44 that may receive the row address GAX_rd and the column address GAY_rd; an eighth inverter IV48 that may receive the output of the fourth NAND gate ND44; a fifth NAND gate ND45 that may receive the output of the eighth inverter IV48, the read/write discriminating signal wtrbt, and the X8 mode selecting signal X8; a ninth inverter IV49 that may receive the output of the fifth NAND gate ND45; a fourth tri-state inverter TIV44 that may output data from a data line GIO_X8 <3> coupled to the fourth tri-state inverter TIV44 according to the output of the fifth NAND gate ND45 and the output of the ninth inverter IV49; a tenth inverter IV50 that may receive the row address GAX_rd; a sixth NAND gate ND46 that may receive the output of the tenth inverter IV50 and the column address GAY_rd; an eleventh inverter IV51 that may receive the output of the sixth NAND gate ND46; a seventh NAND gate ND47 that may receive the output of the eleventh inverter IV51, the read/write classification signal wtrbt, and the X8 mode selecting signal X8; a twelfth inverter IV52 that may receive the output of the seventh NAND gate ND47; a fifth tri-state inverter TIV45 that may output data from a data line GIO_X8 <2> coupled to the fifth tri-state inverter TIV45 according to the output of the seventh NAND gate ND47 and the output of the twelfth inverter IV52; a thirteenth inverter IV53 that may receive the column address GAY_rd; an eighth NAND gate ND48 that may receive the row address GAX_rd and the output of the thirteenth inverter IV53; a fourteenth inverter IV54 that may receive the output of the eighth NAND gate ND48; a ninth NAND gate ND49 that may receive the output of the fourteenth inverter IV54, the read/write discriminating signal wtrbt, and the X8 mode selecting signal X8; a fifteenth inverter IV55 that may receive the output of the ninth NAND gate ND49; a sixth tri-state inverter TIV46 that may output data from a data line GIO_X8 <1> coupled to the sixth tri-state inverter TIV46 according to the output of the ninth NAND gate ND49 and the output of the fifteenth inverter IV55; a sixteenth inverter IV56 that may receive the row address. GAX_rd; a seventeenth inverter IV57 that may receive the column address GAY_rd; a tenth NAND gate ND50 that may receive the output of the sixteenth inverter IV56 and the seventeenth inverter IV57; an eighteenth inverter IV58 that may receive the output of the tenth NAND gate ND50; an eleventh NAND gate ND51 that may receive the output of the eighteenth inverter IV58, the read/write classification signal wtrbt, and the X8 mode selecting signal X8; a nineteenth inverter IV59 that may receive the output of the eleventh NAND gate ND51; and a seventh tri-state inverter TIV47 that may output data from a data line GIO_X8 <0> coupled to the seventh tri-state inverter TIV47 according to the output of the eleventh NAND gate ND51 and the output of the nineteenth inverter IV59.

In a device having the above-described configuration, the number of pads that are used in each of the X32 mode, the X16 mode, and the X8 mode can be freely determined. However, for convenience of description, it is assumed that among the thirty-two pads of the pad unit 500 of FIG. 2, the zero to seventh pads are used in the X8 mode, the zero to fifteenth pads are used in the X16 mode, and the zero to thirty-first pads are used in the X32 mode.

The first selecting unit 321 of FIG. 5 may be coupled to the respective signal lines that correspond to the sixteenth to thirty-first pads used only in the X32 mode, the second selecting unit 322 of FIG. 6 may be coupled to the respective signal lines that correspond to the eighth to fifteenth pads used in both the X32 mode and the X16 mode, and the third selecting unit 323 of FIG. 7 may be coupled to the respective signal lines that correspond to the zero to seventh pads used commonly in the X32 mode, the X16 mode, and the X8 mode.

Accordingly, the sixteen data lines GIO_X32, which may correspond to the sixteenth to thirty-first pads and may be coupled to the first selecting unit 321, correspond to data lines GIO<16> to GIO<31>.

Further, the eight data lines GIO_X32, which may correspond to the eighth to fifteenth pads and may coupled to the second selecting unit 322, correspond to GIO<8> to GIO<15>, the data lines GIO_X16<0> correspond to GIO<16>, GIO<18>, GIO<20>, . . . , and GIO<30> or GIO<17>, GIO<19>, GIO<21>, . . . , and GIO<31>, and the data lines. GIO_X16<1> correspond to GIO<17>, GIO<19>, GIO<21>, . . . , and GIO<31> or GIO<16>, GIO<18>, GIO<20>, . . . , and GIO<30>.

Furthermore, the eight data lines GIO_X32, which may correspond to the zero to seventh pads and may be coupled to the third selecting unit 323, correspond to GIO<0> to GIO<7>, the data lines GIO_X16<0> correspond to GIO<0>, GIO<2>, GIO<4> . . . , and GIO<14> or GIO<1>, GIO<3>, GIO<5>, . . . , and GIO<15>, the data lines GIO_X16<1> correspond to GIO<1>, GIO<3>, GIO<5>, . . . , and GIO<15> or GIO<0>, GIO<2>, . . . , GIO<4>, and GIO<14>, and GIO_X8 <0:3> correspond to GIO<0:3>, GIO<4:7>, GIO<8:11>, and GIO<28:31>.

An exemplary operation of the data output circuit of the semiconductor memory apparatus having the above-described configuration will be described below.

As for the memory specifications shown in FIG. 8, an exemplary row address and an exemplary column address that may be used for the memory capacities and data output modes X8, X16, and X32 are defined. An exemplary memory having a capacity of 256 Mb and a memory having a capacity of 1 Gb may add one bit of row addresses A12 and A13 in the X16 mode and the X8 mode as compared with the X32 mode so as to be used as a control signal for selecting a data line in each corresponding mode.

Accordingly, as shown in FIGS. 6 and 7, a data line may be selected according to a row address GAX_rd corresponding to one bit of a row address A12 in the X16 mode, and a data line may be selected according to the row address GAX_rd and the column address GAY_rd in the X8 mode.

Hereinafter, examples of the operation of the data output circuit of the semiconductor memory apparatus in each of the X32 mode, the X16 mode, and the X8 mode will be described.

-X32 mode-

When a read command is input and the X32 mode is selected, the read/write classification signal wtrbt becomes a level for a read operation (low level), the X32 mode selecting signal is enabled at high level, and the X16 and X8 mode-selecting signals are disabled at low level.

Since the X32 mode selecting signal is at high level and the read/write classification signal wtrbt is at low level, the tri-state inverters TIV21, TIV31, and TIV41 of the first selecting unit 321 of FIG. 5, the first mode selecting unit 322-1 of the second selecting unit 322 of FIG. 6, and the first mode selecting unit 323-1 of the third selecting unit 323 of FIG. 7 are turned-on.

Accordingly, 32-bit data of the data lines GIO<0:31> that correspond to the data lines GIO_X32 is output from the first selecting unit 321 of FIG. 5, the first mode selecting unit 322-1 of the second selecting unit 322 of FIG. 6, and the first mode selecting unit 323-1 of the third selecting unit 323 of FIG. 7, passes through the data output unit 400, and is then output to the outside of the semiconductor memory apparatus through the pad unit 500.

-X16 Mode-

When a read command is input and the X16 mode is selected, the read/write classification signal wtrbt becomes a level for a read operation (low level), the X16 mode selecting signal is enabled at high level, and the X32 and X8 mode selecting signals are disabled at low level.

Since the X16 mode selecting signal is at high level and the read/write classification signal wtrbt is at low level, one of either the second tri-state inverter TIV32 or the third tri-state inverter TIV33 of the second mode selecting unit 322-2 of the second selecting unit 322 of FIG. 6 is turned on according to the row address GAX_rd, and one of either the second tri-state inverter TIV42 or the third tri-state inverter TIV43 of the second mode selecting unit 323-2 of the third selecting unit 323 of FIG. 7 is turned on according to the row address GAX_rd. For example, when the row address GAX_rd is at high level, the tri-state inverters TIV33 and TIV43 are turned on, and when the row address GAX_rd is at low level, the tri-state inverters TIV32 and TIV42 are turned on.

Accordingly, when the row address GAX_rd is at high level, the data lines GIO_X16<1> are selected by the second mode selecting unit 322-2 of the second selecting unit 322 of FIG. 6 and the second mode selecting unit 323-2 of the third selecting unit 323 of FIG. 7, and 16-bit data of the selected data lines passes through the data output unit 400, and is then output to the outside of the semiconductor memory apparatus through the pad unit 500.

Meanwhile, when the row address GAX_rd is at low level, the data lines GIO_X16<0> are selected by the second mode selecting unit 322-2 of the second selecting unit 322 of FIG. 6 and the second mode selecting unit 323-2 of the third selecting unit 323 of FIG. 7, and 16-bit data of the selected data lines passes through the data output unit 400, and is then output to the outside of the semiconductor memory apparatus through the pad unit 500.

At this time, the data lines GIO_X16<0> correspond to GIO<1>, GIO<3>, GIO<5> . . . , and GIO<31> or GIO<0>, GIO<2>, GIO<4>, . . . , and GIO<30>, and the data lines GIO_X16<1> correspond to GIO<0>, GIO<2>, GIO<4>, . . . , and GIO<30> or GIO<1>, GIO<3>, GIO<5> . . . , and GIO<31>.

-X8 Mode-

When a read command is input and the X8 mode is selected, the read/write classification signal wtrbt becomes a level for a read operation (low level), the X8 mode selecting signal X8 is enabled at high level, and the X32 and X16 mode selecting signals are disabled at low level.

Since the X8 mode selecting signal is at high level and the read/write classification signal wtrbt is at low level, one of the fourth to seventh tri-state inverters TIV44 to TIV47 of the third mode selecting unit 323-3 of the third selecting unit 323 of FIG. 7 is turned on according to the result of a logical product of the number of all cases (00, 01, 10, or 11) of the row address GAX_rd and the column address GAY_rd.

For example, when the column address GAY_rd and the row address GAX_rd are at low level (00), the seventh tri-state inverter TIV47 is turned on. When the column address GAY_rd is at low level and the row address GAX_rd is at high level (01), the sixth tri-state inverter TIV46 is turned on. When the column address GAY_rd is at high level and the row address GAX_rd is at low level (10), the fifth tri-state inverter TIV45 is turned on. When the column address GAY_rd and the row address GAX_rd are at high level (11), the fourth tri-state inverter TIV44 is turned on.

When the column address GAY_rd and the row address GAX_rd are at low level (00), the data lines GIO_X8 <0> are selected by the third mode selecting unit 323-3 of the third selecting unit 323 of FIG. 7, and 8-bit data of the data lines GIO_X8 <0> passes through the data output unit 400, and is then output to the outside of the semiconductor memory apparatus through the pad unit 500.

When the column address GAY_rd is at low level and the row address GAX_rd is at high level (01), the data lines GIO_X8 <1> are selected by the third mode selecting unit 323-3 of the third selecting unit 323 of FIG. 7, and 8-bit data of the data lines GIO_X8 <1> passes through the data output unit 400, and is then output to the outside of the semiconductor memory apparatus through the pad unit 500.

When the column address GAY_rd is at high level and the row address GAX_rd is at low level (10), the data lines GIO_X8 <2> are selected by the third mode selecting unit 323-3 of the third selecting unit 323 of FIG. 7, and 8-bit data of the data lines GIO_X8 <2> passes through the data output unit 400, and is then output to the outside of the semiconductor memory apparatus through the pad unit 500.

When the column address GAY_rd and the row address GAX_rd are at high level (11), the data lines GIO_X8 <3> are selected by the third mode selecting unit 323-3 of the third selecting unit 323 of FIG. 7, and 8-bit data of the data lines GIO_X8 <3> passes through the data output unit 400, and is then output to the outside of the semiconductor memory apparatus through the pad unit 500.

At this time, the data lines GIO_X8 <0:3> correspond to GIO<0>, GIO<4>, GIO<8> . . . , and GIO<28>, GIO<1>, GIO<5>, GIO<9>, . . . , and GIO<29>, GIO<2>, GIO<6>, GIO<10>, . . . , and GIO<30>, or GIO<3>, GIO<7>, GIO<11> . . . , and GIO<31>.

Instead of using the row address stored in the peripheral circuit or the row address stored in the bank, the row address GAX_rd may be generated by using the first control signal generating unit 310 of FIG. 4, and may be used for selecting data lines in the X16 mode and the X8 mode. The reason may be as follows.

For example, in a case where the zero memory bank and the first memory bank are sequentially activated and a read operation is sequentially performed thereon, when it is assumed that the row address corresponding to the bit A12 of FIG. 8 is at low level in the zero memory bank and is at high level in the first memory bank, the row address stored in the peripheral circuit of the semiconductor memory apparatus after the first memory bank is activated is maintained at high level.

When the data of the zero memory bank is read using the row address stored in the peripheral circuit, the row address may be changed, which causes a read error of word line data.

Accordingly, as shown in FIG. 4, a row address GAX_rd of a memory bank corresponding to an actual read command among the row addresses BAX<0:3> stored in the respective memory banks may be determined by using a command recognition signal cast12<0:3> enabled only when a read command is actually input for each memory bank. A data line may be selected by using the row address GAX_rd. Therefore, reliable data output control can be made.

It will be apparent to those skilled in the art that various modifications and changes may be made without departing from the scope and spirit of the present invention. Therefore, it should be understood that the above embodiments are not limiting, but illustrative in all aspects. The scope of the present invention is defined by the appended claims rather than by the description preceding them, and therefore all changes and modifications that fall within the metes and bounds of the claims, or equivalents of such metes and bounds, are therefore intended to be embraced by the claims.

According to the data output circuit of the semiconductor memory apparatus and the method of controlling the same according to an embodiment of the present invention, the following effects may be obtained.

First, since it may be unnecessary to provide local data bus lines to transmit data among sense amplifiers inside a memory bank, a layout area can be reduced, and a circuit design can be simplified.

Second, since data may be directly output through the data lines outside the memory bank without transmitting the data among the sense amplifiers, a data output time can be reduced, and thus the operation speed of the semiconductor memory apparatus can be increased.

Third, since a data output control operation may be performed in a state where an address of a memory bank according to a read command may be accurately detected, the reliability of the semiconductor memory apparatus can be improved.

What is claimed is:

1. A data output circuit for a semiconductor memory apparatus, the data output circuit comprising:
   a plurality of pads, respective ones of the pads being configured to be used exclusively in one of at least two kinds of unit data output modes or used commonly in all of the at least two kinds of unit data output modes;
   a plurality of data lines configured to transmit data from a plurality of memory banks to outside of the memory banks; and
   a data output control unit configured to output data from a data line among the plurality of data lines, according to at least one control signal, to respective signal lines corresponding to the pads used in a currently set unit data,
   wherein the data output control unit includes:
   a first control signal generating unit that is configured to generate a first control signal according to a command recognition signal that is enabled when a row address and a read command are input; and
   a data selecting unit that is configured to select data from the data line according to the first control signal or a second control signal, and output the data to the signal line corresponding to the pad used in the currently selected unit data output mode among the plurality of pads.

2. The data output circuit of claim 1,
wherein the first control signal is a row address that corresponds to one of the plurality of memory banks, and is activated according to a read command.

3. The data output circuit of claim 1,
wherein the second control signal is a column address.

4. The data output circuit of claim 1,
wherein the first control signal generating unit includes:
a plurality of first NAND gates, each of which has inputs is configured to respectively receive a row address for each bank and a command recognition signal related to the corresponding bank and to produce an output; and
a second NAND gate is configured to receive the output of the plurality of first NAND gates, and to output the first control signal.

5. The data output circuit of claim 1,
wherein the data selecting unit includes:
a plurality of selecting units, each of which is configured to select data from at least one data line coupled to each selecting unit according to at least one among a read/write classification signal, the first control signal, and the second control signal, and output the data to the signal line corresponding to the pad used in a unit data output mode corresponding to each selecting unit, when the unit data output mode corresponding to each selecting unit is selected.

6. The data output circuit of claim 1,
wherein the data selecting unit includes:
a first selecting unit that is configured to output data from the data line coupled to the first selecting unit to the signal line corresponding to the pad used in a first unit data output mode, according to whether the first unit data output mode is selected or not;
a second selecting unit that is configured to output data from a data line among the plurality of data lines that is coupled to the second selecting unit according to the first control signal among data lines to the signal line corresponding to the pad used in the first unit data output mode and a second data output mode, according to whether one among the first unit data output mode and the second unit data output mode is selected or not; and
a third selecting unit that is configured to output data from the data line among the plurality of data lines that is coupled to the third selecting unit according to the first control signal and the second control signal to the signal line corresponding to the pad used in the first unit data output mode, the second unit data output mode, and a third unit data output mode, according to whether not to select one among the first unit data output mode, the second unit data output mode, and the third unit data output mode.

7. The data output circuit of claim 6,
wherein the first selecting unit outputs data from the data line coupled to the first selecting unit to the signal line corresponding to the pad used in the first unit data output mode, when a read/write classification signal is at a level for a read operation and a first unit data output mode selecting signal is enabled.

8. The data output circuit of claim 6,
wherein the first selecting unit includes:
a NAND gate that is configured to receive an inverted read/write classification signal and a first unit data output mode selecting signal and to produce an output; and
a switch that is configured to output data from a data line coupled to the switch according to the output of the NAND gate.

9. The data output circuit of claim 6,
wherein the second selecting unit includes:
a first mode selecting unit that is configured to output, when a read/write classification signal is at a level for a read operation and a first unit data output mode selecting signal is enabled, data from a data line among the plurality of data lines that is coupled to the first mode selecting unit to the signal line corresponding to the pad used in the first unit data output mode; and
a second mode selecting unit that is configured to output, when the read/write classification signal is at a level for a read operation and the second unit data output mode selecting signal is enabled, data from a data line among the plurality of data lines that is coupled to the second mode selecting unit according to the first control signal coupled to the signal line corresponding to the pad used in the second unit data output mode.

10. The data output circuit of claim 9,
wherein the first mode selecting unit includes:
a NAND gate that is configured to receive an inverted read/write classification signal and the first unit data output mode selecting signal; and a switch that is configured to output data from a data line coupled to the switch according to the output of the NAND gate.

11. The data output circuit of claim 9,
wherein the second mode selecting unit includes:
a first NAND gate that is configured to receive an inverted first control signal, the read/write classification signal, and a second unit data output mode selecting signal and to produce an output based thereon;
a first switch that is configured to output data from a data line coupled to the first switch according to the output of the first NAND gate;
a second NAND gate that receives the first control signal, the read/write classification signal, and the second unit data output mode selecting signal and to produce an output based thereon; and
a second switch that is configured to output data from a data line coupled to the second switch according to the output of the second NAND gate.

12. The data output circuit of claim 6,
wherein the third selecting unit includes:
a first mode selecting unit that is configured to output, when a read/write classification signal is at a level for a read operation and a first unit data output mode selecting signal is enabled, data from a data line coupled to the first mode selecting unit to the signal line corresponding to the pad used in the first unit data output model;
a second mode selecting unit that is configured to output, when the read/write classification signal is at a level for a read operation and the second unit data output mode selecting signal is enabled, data from a data line according to the first control signal among data lines coupled to the second mode selecting unit to the signal line corresponding to the pad used in the second unit data output mode; and
a third mode selecting unit that is configured to output, when the read/write classification signal is at a level of defining read and a third unit data output mode selecting signal is enabled, data from a data line according to the first control signal and the second control signal among a plurality of data lines coupled to the third mode selecting unit to a signal line corresponding to a pad used in a third unit data output mode.

13. The data output circuit of claim 12,
wherein the first mode selecting unit includes:
a NAND gate that receives an inverted read/write classification signal and the first unit data output mode selecting signal and to produce an output based thereon; and
a switch that is configured to output data from a data line coupled to the switch according to the output of the NAND gate.

14. The data output circuit of claim 12,
wherein the second mode selecting unit includes:
a first NAND gate that receives an inverted first control signal, the read/write classification signal, and the second unit data output mode selecting signal and to produce an output based thereon;
a first switch that is configured to output data from a data line coupled to the first switch according to the output of the first NAND gate;
a second NAND gate that receives the first control signal, the read/write classification signal, and the second unit data output mode selecting signal and to produce an output based thereon; and
a second switch that is configured to output data from a data line coupled to the second switch according to the output of the second NAND gate.

15. The data output circuit of claim 12,
wherein the third mode selecting unit includes:
a plurality of NAND gates that commonly receive the read/write classification signal and a third unit data output mode selecting signal for the number of logical values of the first control signal and the second control signal and to produce an output based thereon; and
a plurality of switches, each of which is configured to output data from a data line coupled to each switch according to the output of each of the plurality of NAND gates.

16. The data output circuit of claim 12,
wherein the third mode selecting unit includes:
a first NAND gate that receives the read/write classification signal and the third unit data output mode selecting signal and to produce an output based thereon;
a first switch that is configured to output data from a data line coupled to the first switch according to the output of the first NAND gate;
a second NAND gate that receives the read/write classification signal and the third unit data output mode selecting signal and to produce an output based thereon;
a second switch that is configured to output data from a data line coupled to the second switch according to the output of the second NAND gate;
a third NAND gate that receives the read/write classification signal and the third unit data output mode selecting signal and to produce an output based thereon;
a third switch that is configured to output data from a data line coupled to the third switch according to the output of the third NAND gate;
a fourth NAND gate that receives the read/write classification signal and the third unit data output mode selecting signal and to produce an output based thereon; and
a fourth switch that is configured to output data from a data line coupled to the fourth switch according to the output of the fourth NAND gate.

17. An output circuit for a semiconductor memory apparatus that is configured to first to third unit data output modes in which a numbers of bits of data output according to a one-time read command are respectively 32, 16, or 8, the output circuit comprising:
a plurality of pads in which pads used in at least one among the first to third unit data output modes are determined;
a plurality of data lines that transmit data from memory banks to outside of the memory banks; and
a data output control unit that is configured to output data from a data line among the plurality of data lines, according to at least one of either a first control signal or a second control signal, to signal lines corresponding to the pads used in a currently set unit data output mode,
wherein the data output control unit includes:
a first control signal generating unit that is configured to generate the first control signal using a command recognition signal generated for each memory bank according to a row address and a read command; and
a data selecting unit that is configured to select data from one of the data lines according to at least one of either the first control signal or the second control signal, and output the data to the signal line that corresponds to the pad used in the currently selected unit data output mode.

18. The data output circuit of claim 17,
wherein the first control signal is a row address that corresponds to one of the memory banks, and is activated according to the read command.

19. The data output circuit of claim 17, wherein the second control signal is a column address that corresponds to one of the memory banks, and is activated according to the read command.

20. The data output circuit of claim 17,
wherein the first control signal generating unit includes:
a plurality of first NAND gates, each of which receives a row address for each bank and a command recognition signal related to the corresponding bank and to produce an output based thereon; and
a second NAND gate that receives the output of the plurality of first NAND gates, and outputs the first control signal.

21. The data output circuit of claim 17,
wherein the data selecting unit includes:
a first selecting unit that is configured to output, when a first unit data output mode selecting signal is enabled, data from the data line that is coupled to the first selecting unit to the signal line that corresponds to the pad used in the first unit data output mode;
a second selecting unit that is configured to output, when one of either the first unit data output mode selecting signal and a second unit data output mode selecting signal is enabled, data from the data line among data lines coupled to the second selecting unit, according to the first control signal, to the signal line that corresponds to the pad used in the first unit data output mode and the second data output mode; and
a third selecting unit that is configured to output, when one among the first unit data output mode selecting signal, the second unit data output mode selecting signal, and a third unit data output mode selecting signal is enabled, data from the data line among data lines coupled to the third selecting unit, according to the first control signal and a second control signal, to the signal line that corresponds to the pad used in the first unit data output mode, the second unit data output mode, and a third unit data output mode.

22. The data output circuit of claim 21,
wherein the first selecting unit includes:
a NAND gate that is configured to receive an inverted read/write classification signal and the first unit data output mode selecting signal and to produce an output based thereon; and
a switch that is configured to output data from a data line coupled to the switch according to the output of the NAND gate.

23. The data output circuit of claim 21,
wherein the second selecting unit includes:
a first mode selecting unit that is configured to output, when the read/write classification signal is at a level for a read operation and the first unit data output mode selecting signal is enabled, data from a data line coupled to the first mode selecting unit to the signal line corresponding to the pad used in the first unit data output mode; and
a second mode selecting unit that is configured to output, when the read/write classification signal is at a level for a read operation and the second unit data output mode selecting signal is enabled, data from a data line among data lines coupled to the second mode selecting unit, according to the first control signal, to the signal line corresponding to the pad used in the second unit data output mode.

24. The data output circuit of claim 23,
wherein the first mode selecting unit includes:
a NAND gate that is configured to receive an inverted read/write classification signal and the first unit data output mode selecting signal and to produce an output based thereon; and
a switch that is configured to output data from a data line coupled to the switch according to the output of the NAND gate.

25. The data output circuit of claim 23,
wherein the second mode selecting unit includes:
a first NAND gate that is configured to receive an inverted first control signal, the read/write classification signal, and the second unit data output mode selecting signal and to produce an output based thereon;
a first switch that is configured to output data from a data line coupled to the first switch according to the output of the first NAND gate;
a second NAND gate that is configured to receive the first control signal, the read/write classification signal, and the second unit data output mode selecting signal and to produce an output based thereon; and
a second switch that is configured to output data from a data line coupled to the second switch according to the output of the second NAND gate.

26. The data output circuit of claim 23,
wherein the third selecting unit includes:
a first mode selecting unit that is configured to output, when the read/write classification signal is at a level for a read operation and the first unit data output mode selecting signal is enabled, data from a data line coupled to the third selecting unit to the signal line corresponding to the pad used in the first unit data output mode;
a second mode selecting unit that is configured to output, when the read/write classification signal is at a level for a read operation and the second unit data output mode selecting signal is enabled, data from a data line data among a plurality of data lines coupled to the second mode selecting unit, according to the first control signal, to the signal line corresponding to the pad used in the second unit data output mode;
a third mode selecting unit that is configured to output, when the read/write classification signal is at a level for a read operation and the third unit data output mode selecting signal is enabled, data from a data line among a plurality of data lines coupled to the third mode selecting unit, according to the first control signal and the second control signal, to a signal line corresponding to a pad used in the third unit data output mode.

27. The data output circuit of claim 26,
wherein the first mode selecting unit includes:
a NAND gate that is configured to receive an inverted read/write classification signal and the first unit data output mode selecting signal and to produce an output based thereon; and
a switch that is configured to output data from a data line coupled to the switch according to the output of the NAND gate.

28. The data output circuit of claim 26,
wherein the second mode selecting unit includes:
a first NAND gate that is configured to receive an inverted first control signal, the read/write classification signal, and the second unit data output mode selecting signal and to produce an output based thereon;
a first switch that is configured to output data from a data line coupled to the first switch according to the output of the first NAND gate;

a second NAND gate that is configured to receive the first control signal, the read/write classification signal, and the second unit data output mode selecting signal and to produce an output based thereon; and a second switch that is configured to output data from a data line coupled to the second switch according to the output of the second NAND gate.

29. The data output circuit of claim 26, wherein the third mode selecting unit includes:

a first NAND gate that is configured to receive the read/write classification signal and the third unit data output mode selecting signal, as a result of performing a logical product on the first control signal and the second control signal, a first switch that is configured to output data from a data line coupled to the first switch according to the output of the first NAND gate;

a second NAND gate that is configured to receive the read/write classification signal and the third unit data output mode selecting signal, as a result of performing a logical product on an inverted first control signal and the second control signal and to produce an output based thereon;

a second switch that is configured to output data from a data line coupled to the second switch according to the output of the second NAND gate;

a third NAND gate that is configured to receive the read/write classification signal and the third unit data output mode selecting signal, as a result of performing a logical product on the first control signal and an inverted second control signal and to produce an output based thereon;

a third switch that is configured to output data from a data line coupled to the third switch according to the output of the third NAND gate;

a fourth NAND gate that is configured to receive the read/write classification signal and the third unit data output mode selecting signal, as a result of performing a logical product on the inverted first control signal and the inverted second control signal and to produce an output based thereon; and a fourth switch that is configured to output data from a data line coupled to the fourth switch according to the output of the fourth NAND gate.

30. A method of outputting data of a semiconductor memory apparatus that includes a plurality of pads for which a range of use is determined such that the respective pads are used exclusively in each of at least two kinds of unit data output modes or used commonly in all of the at least two kinds of unit data output modes, and a plurality of data lines that transmit data from a plurality of memory banks to the outside of the memory banks, the method comprising:

acquiring at least one control signal so as to output data from a memory bank according to a read command;

selecting a data line according to the at least one acquired control signal; and outputting data from the selected data line to a signal line corresponding to a pad used in a currently set unit data output mode among the plurality of pads, wherein the at least one control signal includes a row address and a column address that correspond to a memory bank that is activated according to the read command among the plurality of memory banks.

31. The method of claim 30, wherein the acquiring of at least one control signal so as to output data from the memory bank according to the read command includes selecting a row address of a signal pair where command recognition signals are enabled among signal pairs of the command recognition signals that are enabled when a row address and a read command are input for each memory bank.

32. The method of claim 30, wherein the selecting of the data signal corresponding to the currently set unit data mode among the plurality of data lines according to the at least one control signal acquired from the plurality of data lines includes selecting a data line according to the at least one acquired control signal from at least one different data line, according to a result of a combination of a number of the at least one control signal.

33. A method of outputting data of a semiconductor memory apparatus that includes a plurality of pads in which a range of use is determined such that the respective pads are used exclusively in one of at least two kinds of unit data output modes or used commonly in all of the at least two kinds of unit data output modes, and a plurality of data lines that transmit data from a plurality of memory banks to the outside of the memory banks, the method comprising:

detecting a row address corresponding to a memory bank to which a read command is input;

selecting a data line according to at least one of either the row address or a column address from among the plurality of data lines; and outputting data from the selected data line to a signal line corresponding to the pad used in a currently set unit data output mode among the plurality of pads.

34. The method of claim 33, further comprising dividing the plurality of data lines into a plurality of groups, each of which includes the predetermined number of data lines, and determining a number of data lines that are used in each of the at least two kinds of unit data output modes in each group.

35. The method of claim 33, wherein the detecting of the row address corresponding to the memory bank to which the read command is input includes selecting a row address of a signal pair where command recognition signals are enabled among signal pairs of the command recognition signals that are enabled when a row address and a read command are input for each memory bank.

36. The method of claim 33, wherein the selecting of the data line according to at least one of either the row address and the column address from among the plurality of data lines includes selecting a data line according to the row address and the column address from among a plurality of different data lines, according to the result of a combination of a number of row addresses and the column addresses.

* * * * *